United States Patent [19]

Murry

[11] Patent Number: 5,563,489
[45] Date of Patent: Oct. 8, 1996

[54] STARTER CONTACT INTEGRITY TEST

[75] Inventor: Michael W. Murry, Onalaska, Wis.

[73] Assignee: American Standard Inc., Piscataway, N.J.

[21] Appl. No.: 222,214

[22] Filed: Mar. 31, 1994

[51] Int. Cl.[6] ............................................. H02P 1/02
[52] U.S. Cl. .................. 318/778; 324/538; 361/78
[58] Field of Search ............................... 318/771, 778;
307/115; 310/112, 68 R; 361/23, 25, 31,
78, 77, 71; 324/537, 772, 538, 500

[56] References Cited

U.S. PATENT DOCUMENTS

| | | | |
|---|---|---|---|
| 3,916,257 | 10/1975 | Harper, Jr. | 318/771 |
| 4,368,394 | 1/1983 | Naimer | 307/115 |
| 4,427,933 | 1/1984 | Wagener et al. | 318/711 |
| 4,446,415 | 5/1984 | Taylor et al. | 318/771 |
| 4,470,092 | 9/1984 | Lombardi | 361/23 |
| 4,609,858 | 9/1986 | Sugita et al. | 318/778 |
| 4,689,546 | 8/1987 | Stephens et al. | 322/99 |
| 4,833,460 | 5/1989 | Sabo | 340/658 |
| 5,006,778 | 4/1991 | Bashark | 318/799 |
| 5,049,800 | 9/1991 | Kohari et al. | 318/772 |
| 5,051,639 | 9/1991 | Satake et al. | 318/771 |
| 5,065,305 | 11/1991 | Rich | 318/771 |
| 5,142,213 | 8/1992 | Stelter | 318/771 |

OTHER PUBLICATIONS

*Standard Handbook For Electrical Engineers*, Donald G. Fink, 1978, pp. 20–78 through 20–83.
*Power And Control Circuits For Motors*, J. F. McPartland, 1981, pp. 88–91.
*Wiring*, The Trane Company, "Water–Cooled Hermetic CenTraVac", Sep. 1986.

*Primary Examiner*—John W. Cabeca
*Attorney, Agent, or Firm*—William J. Beres; William O'Driscoll; Peter D. Ferguson

[57] ABSTRACT

An apparatus for detecting faults in a starter circuit adapted to connect a multi-phase electrical motor to a power supply. The motor has at least one winding per phase, each of which terminates in at least one terminal. The starter circuit includes a plurality of contactors which are energizable to connect the motor windings to the power source. The fault detection apparatus comprises a current sensor for sensing the current flowing through the windings of each phase and responsively producing respective winding current signals. A diagnostic module controllably energizes the contactors, samples for the presence and absence of the winding current signals while different ones of the contactors are energized to detect faults in the contactors, and responsively produces fault signals.

30 Claims, 5 Drawing Sheets

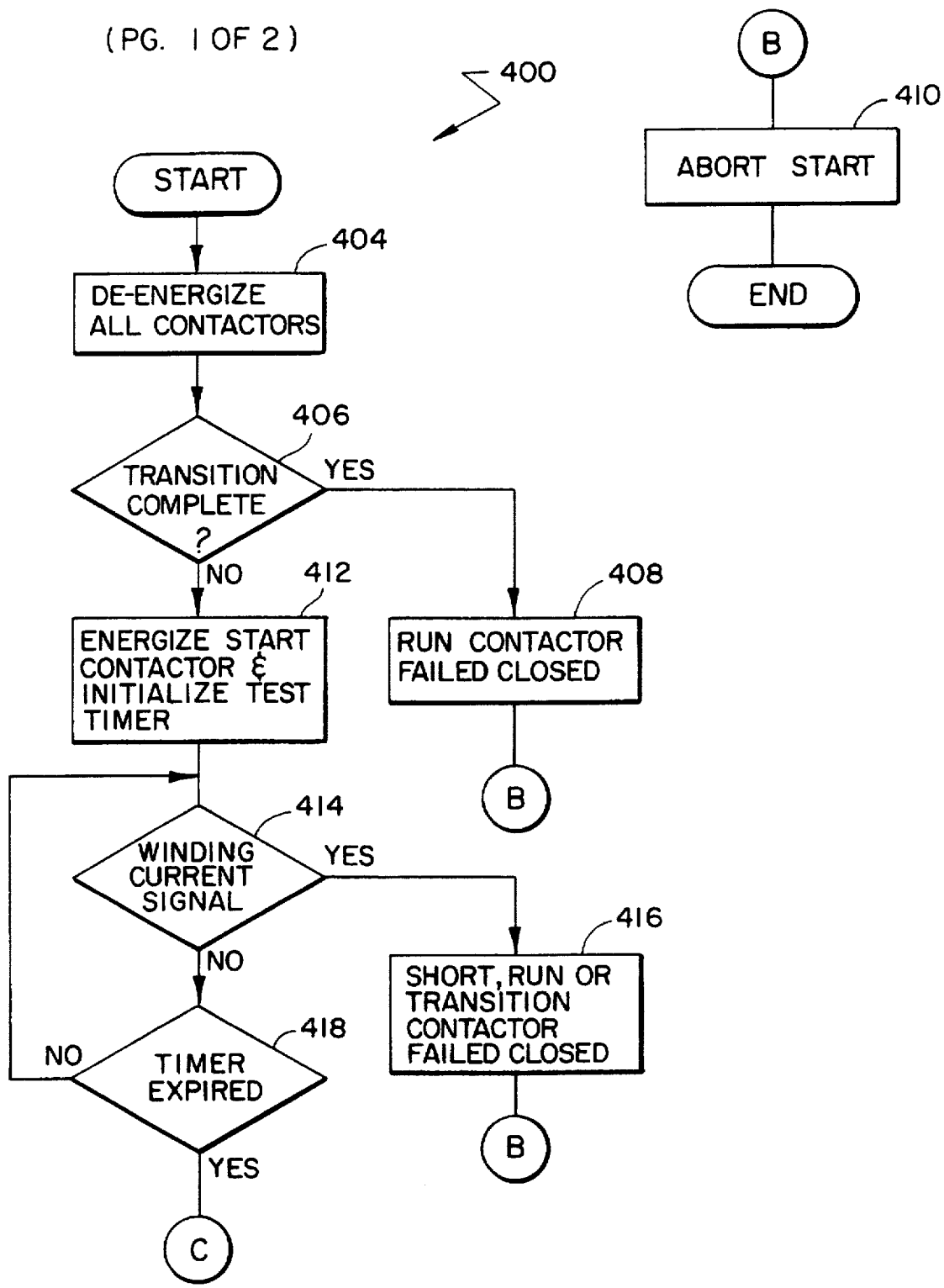

(PG. 2 OF 2)

STARTER CONTACT INTEGRITY TEST

FIELD OF THE INVENTION

This invention relates generally to starter circuits for electric motors and, more particularly, to a method for detecting failed contactors in starter circuits.

BACKGROUND OF THE ART

Starter circuits are well known for energizing electric motors by connecting the motor's windings to an external source of power. Starter circuits typically employ a plurality of contacts which are selectively opened and closed to connect the motor terminals to the power source. Proper operation of the electric motor is dependent on proper operation of the contacts in the starter circuit. In known systems, the starter circuit must be disassembled and physically examined to detect and diagnose the cause of the circuit's failure. This process is undesirable because it is costly and time consuming.

One known application for electric motors is to drive chiller compressors in large heating, ventilation, and air condition (HVAC) systems. The starter circuit cycles the motor on and off to operate the compressor and control the temperature of water in the chiller circuit. In such applications, motor failure can damage the compressor and shut down the HVAC system, resulting in expensive repair costs and reduced office productivity. The problem is magnified when the motor is part of an HVAC for a large office building, where failure of the HVAC system can result in reduced or lost productivity on the part of a large number of individuals.

The present invention is directed to overcoming the above-mentioned problems by providing a system which automatically detects and diagnosis electrical faults in motor starter circuits.

SUMMARY OF THE INVENTION

In accordance with one aspect of the present invention, an apparatus is provided for detecting faults in a motor starter circuit used to connect the motor windings to a power supply. The motor has at least one winding per phase, each of which terminates in at least one terminal. The starter circuit includes a plurality of contactors which are energizable to connect the motor windings to the power source. The fault detection apparatus comprises a current sensing means for sensing the current flowing through the windings of each motor phase and responsively producing respective winding current signals. A diagnostic means controllably energizes the contactors, samples for the presence and absence of the winding current signals while different ones of the contactors are energized to detect faults in the contactors, and responsively produces fault signals.

Other aspects, objects, and advantages of the invention will become apparent upon reading the following detailed description and appended claims, and upon reference to the accompanying drawings.

DETAILED DESCRIPTION OF THE PREFERRED EMBODIMENT

Figure 1:
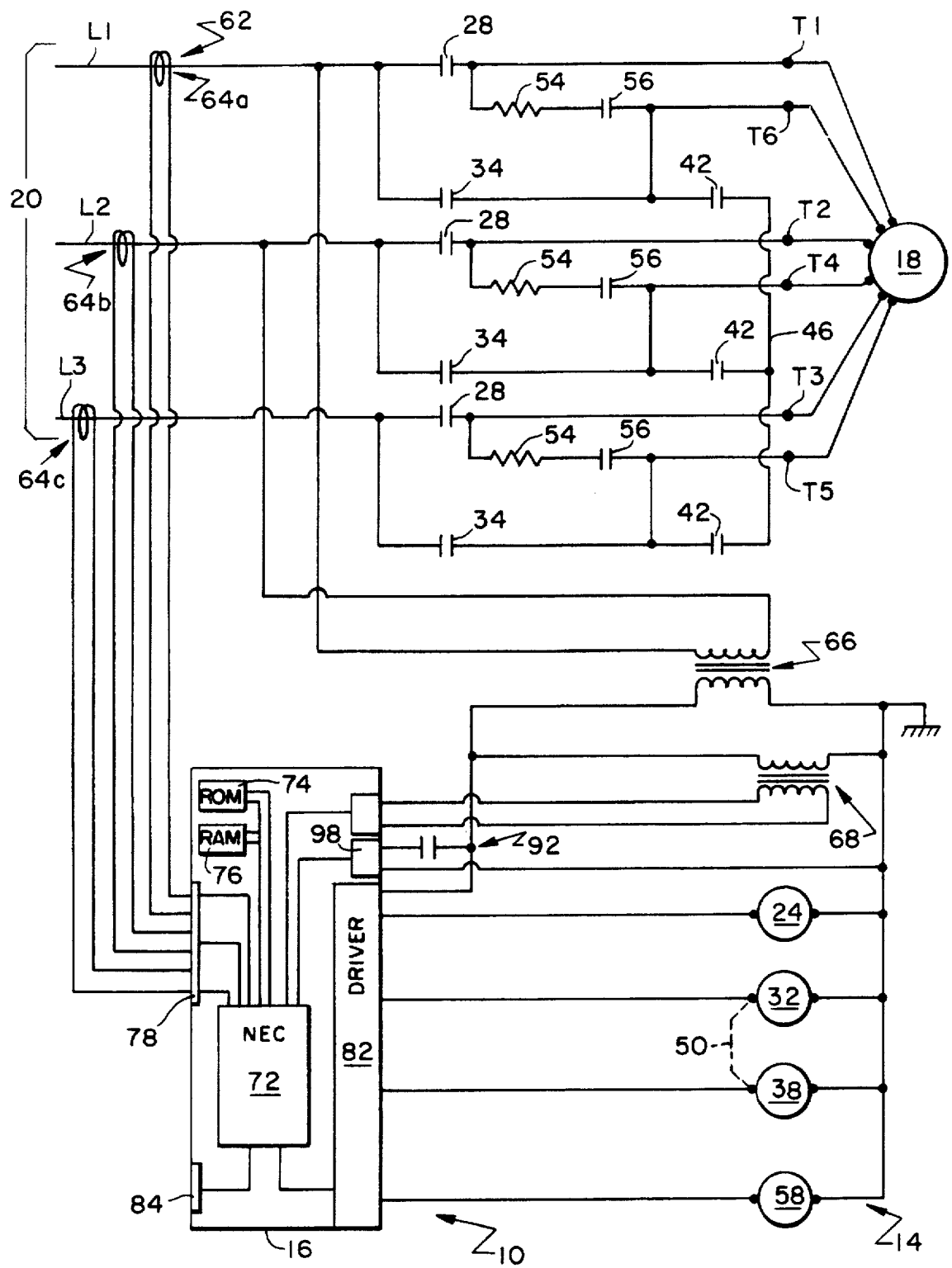
FIG. 1 is a schematic drawing of a starter control module incorporating an embodiment of the present invention.

Referring now to FIG. 1 a diagnostic means 10 is provided for detecting faults in a starter circuit 14. The diagnostic means 10 is embodied in a microprocessors-based starter control module 16 which is programmed to control operation of the starter circuit 14 and to perform diagnostics to detect failed conditions (in the starter circuit 14). More specifically, the control module 16 controllably energizes contactors in the starter circuit 14 and samples for the presence and absence of current flow in the motor windings to detect fault conditions in the contractors.

In FIG. 1, the diagnostic means 10 is illustrated in connection with a closed transition wye-delta starter circuit which energizes a three phase motor 18 from a three phase power source 20. Although the diagnostic means 10 is described in connection with a wye-delta starter circuit, it should be appreciated that the diagnostic means 10 is suitable for use with other starter circuits having contactors for connecting motor terminals to a power source.

The three phase motor 18 includes three sets of phase windings (not shown), each of which terminates in respective first and second electrical terminals. The motor terminals have been labeled T1, T2, T3, T4, T5 and T6, where T1 and T4 represent the first and second terminals of the first motor phase, T2 and T5 represent the first and second terminals of the second motor phase and T3 and T6 represent the first and second terminals of the third motor phase.

The wye-delta starter circuit 14 is responsive to control signals produced by the control module 16 for connecting the motor terminals T1–T6 to power lines L1, L2, L3 from the three phase power supply. For this purpose, the starter circuit 14 includes a start contactor 24 in the form of a three pole contractor. The contacts 28 of the start contactor 24 are connected between the motor winding first terminals T1, T2, T3 and the power supply 20. The start contactor 24 is adapted to receive a start signal from the control module 16 and responsively close its contacts 28, thereby connecting each of the winding first terminals T1, T2, T3 to a different one of the power supply lines L1, L2, L3.

A run contactor 32, in the form of a second three pole contactor, has its contacts connected between the motor second terminals T4, T5, T6 and the power supply 20. The run contactor 32 is adapted to receive a run signal from the control module 16 and responsively close its contacts 34 to connect each of the winding second terminals T4, T5, T6 to a different respective line L2, L3, L1 from the three phase power source 20.

A shorting contactor 38, in the form of a third three pole contactor, has its contacts 42 connected between the motor second terminals T4, T5, T6 and a point of common potential 46. The shorting contractor 38 is adapted to receive a short signal from the control module and responsively close the shorting contacts 42, thereby connecting the winding second terminals T4, T5, T6 at the same potential.

The control module 16 is programmed to energize the motor 18 in a wye configuration by simultaneously closing the contacts of the run and shorting contactors 24, 38, and then to energize the motor in a delta configuration by simultaneously closing the contacts of the start and run contactors 24, 32. A mechanical linkage 50 between the run contactor 32 and the shorting contactor 38 prevents the simultaneous closure of these two contactors.

The starter circuit 14 further includes three transition resistors 54 which are used to keep the motor winding voltages in phase with the power lines during transition from the wye configuration to the delta configuration. Each transition resistor 54 has a first terminal connected a junction of a start contact 28 and a motor first terminal T1, T2, T3 and a second terminal connected to different ones of the motor second terminals T4, T5, T6 through respective transition contacts 56. A transition contactor 58 is adapted to receive a transition signal from the control module 16 and responsively close the transition contacts 56. During transition, the contacts of the transition contactor 58, the start contactor 24 and the shorting contactor 38 are initially closed such that each of the transition resistors 54 is in parallel with the windings of a different one the motor phases. Subsequently, the shorting contactor 38 is deenergized to connect the transition resistors 54 in series with the motor windings. The run contactor 32 is then closed, thereby shorting around the transition resistors 54 and energizing the motor 18 at full line potential.

A current sensing means 62 is provided for sensing the current flowing through the motor windings and responsively producing respective winding current signals. The current sensing means 62 is in the form of three current transformers 64a–c, each of which is adapted to sense the current flowing through the windings of different motor phase and responsively produce a respective winding current signal.

A first step down transformer 66 is connected to two lines L1, L2 from the power source 20 to produce a D.C. output potential suitable for energizing the contactors 24, 32, 38, 58. A second step down transformer 68 further reduces the output from the first step down transformer 66 to a level suitable for powering the control module 16.

The control module 16 includes a commercially available microprocessor 72, such as an NEC 78C 17IT, a read only memory (ROM) 74, and a random access memory (RAM) 76. As in a conventional computer system, the microprocessor 72 operates in accordance with a software program contained in the ROM 74 and utilizes the RAM 76 for scratch-pad memory. The control module 16 also includes an input 78 for receiving the winding current signals from the current transformers 64. A contactor driver circuit 82 receives control signals from the microprocessor 72 and responsively energizes the contactors 24, 32, 38, 58 by connecting them between the output of the first step down transformer 66 and ground. A communication interface 84 is provided to permit the control module 16 to communicate with remote devices such as other control modules.

A transition sensor 92 senses transition of the motor from the wye configuration to the delta configuration and responsively produces a transition complete signal. The transition sensor 92 is an auxiliary run contact connected between the output of the first step down transformer 66 and ground. The auxiliary run contact 92 is normally biased open and is closed by the run contactor 32 when the run contactor 32 is energized. The control module 16 includes an input 98 for sensing the potential applied by the closing of the auxiliary run contactor 92 to determine whether the auxiliary contact 92 is open or closed.

During a diagnostic mode, the control module 16 controllably energizes the contactors 24, 32, 38, 58 by producing the short, start, run, and transition signals. The control module is programmed to detect failed conditions in the contactors by sampling for the presence and absence of the winding current signals while different combinations of the short, start, run, and transition signals are produced. When a fault is detected the control module 16 responsively produces a fault signal which indicates the nature of detected fault. More specifically, the control module 16 produces a contactor failed closed signal in response to the presence of a winding current signal during production of only the start signal, a start contactor failed closed signal in response to the presence of winding current signal during production of only the short signal, a contactor failed open signal in response to the absence of a winding current signal during simultaneous production of the short signal and the start signal, a run contactor failed closed signal in response to the presence of the transition completed signal and the absence of the run signal, a run contactor failed open signal in response to the absence of the transition completed signal and the presence of the run signal.

The control module 16 can be provided with a memory such as an EEPROM (not shown) for storing the fault conditions. In addition, the control module 16 can be programmed to communicate the fault signals to other devices via the interface 84.

Figure 2:
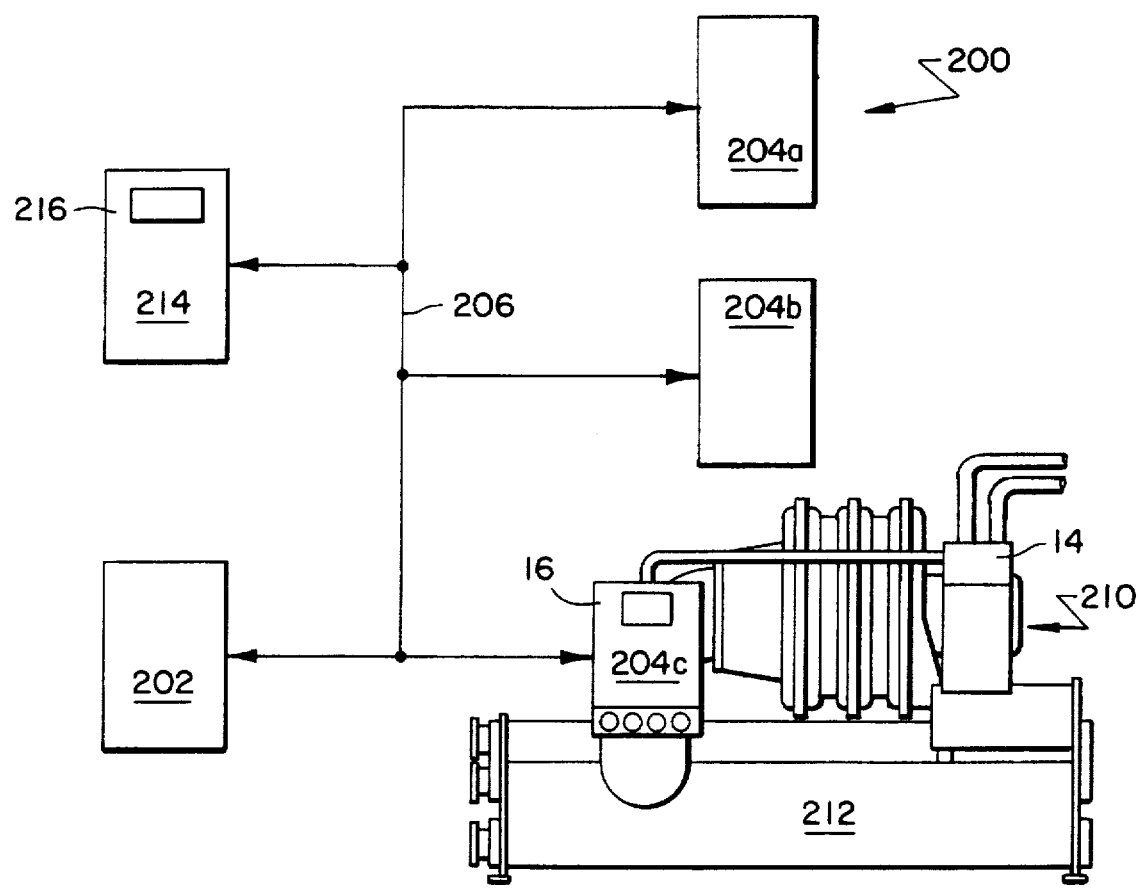
FIG. 2 is a diagrammatic illustration of an HVAC control system incorporating the control module of FIG. 1.

Referring now to FIG. 2, the starter control module 16 is illustrated in connection with a microprocessor based control system 200 for a heating ventilation and air conditioning (HVAC) system (not shown). The control system 200 includes main control module 202 and a plurality of remote control modules 204a–c connected via a shared data link 206 such as a conventional RS485 twisted pair data link. Each control module 202, 204 is in the form of an individual microprocessor-based controller similar to the one described above in connection with FIG. 1. More specifically, each control module 202, 204 includes a microprocessor, ROM, RAM, input circuits, output circuits and a communication interface. The various control modules are programmed to control different components within the HVAC system. The starter control module 16, in particular, controls a compressor motor 210 on a chiller unit 212 such as a CenTraVac brand chiller as manufactured by the Trane Company of La Crosse, Wis.

The main control module 202 is programmed to control the overall sequencing of the various components within the control system by issuing control commands to the remote modules via the data link 204. The remote control modules 204 receive the commands and take responsive actions such as controlling various HVAC components and performing diagnostic tests. Data, including fault signals and parameter data, is transmitted from the remote modules 204 to the main control module 202 via the data link 206. The main control module 202 receives data and takes appropriate action to ensure proper operation of the HVAC system. A display module 214 is provided for displaying various parameter and to provide a visual indication of the nature of the detected faults. For this purpose, the display module includes a display screen 216 such as liquid crystal display (LCD).

Figure 3:
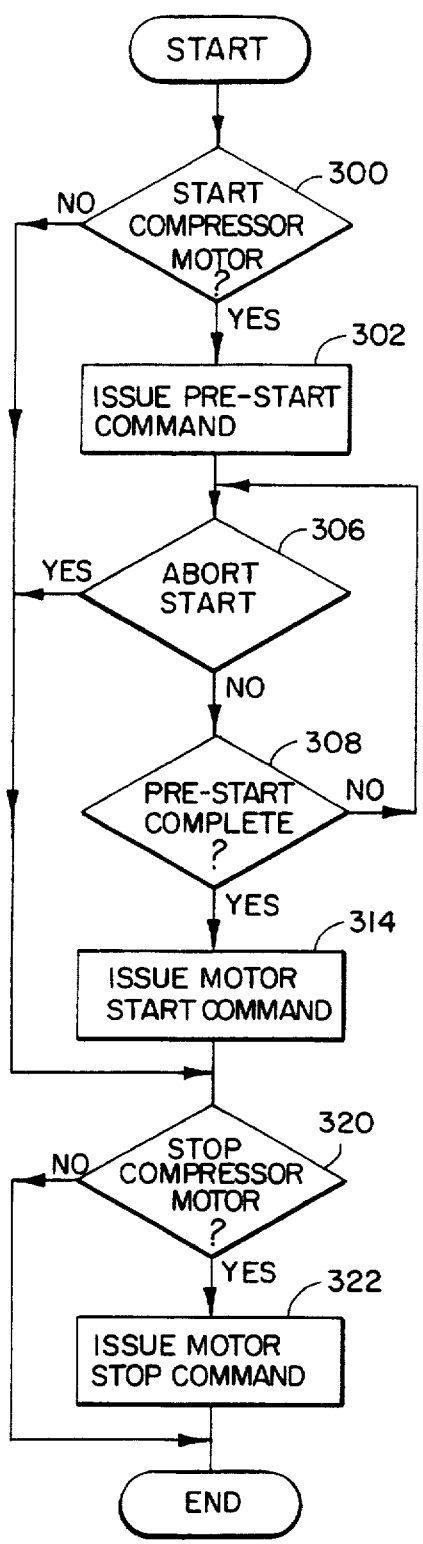
FIG. 3 is a software flowchart of a computer program executed by a main controller in the HVAC control system of FIG. 2.
Figure 5:
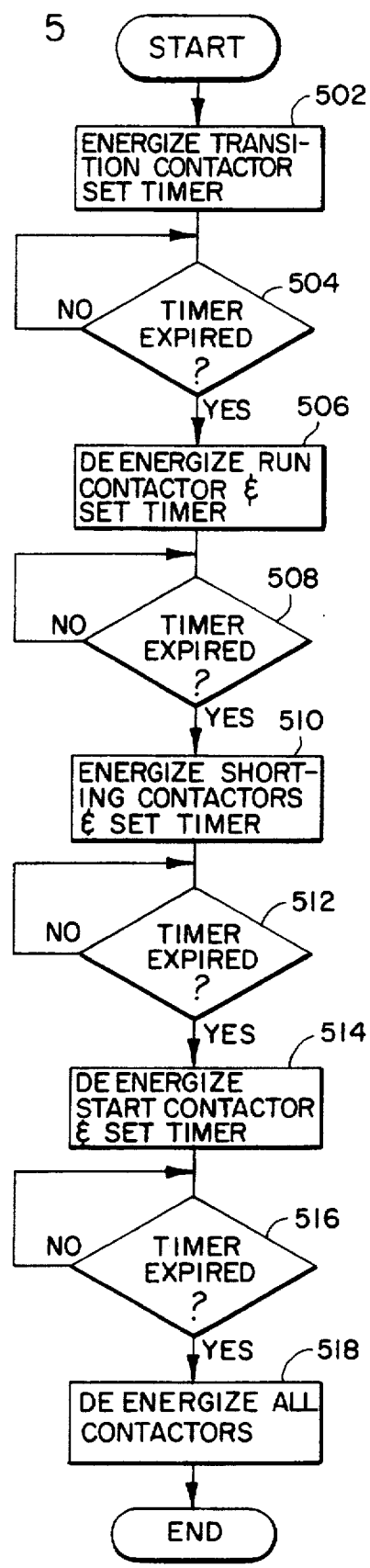
FIG. 5 is a software flowchart of a first embodiment of a STOP routine executable by the control module of FIG. 1.
Figure 4:
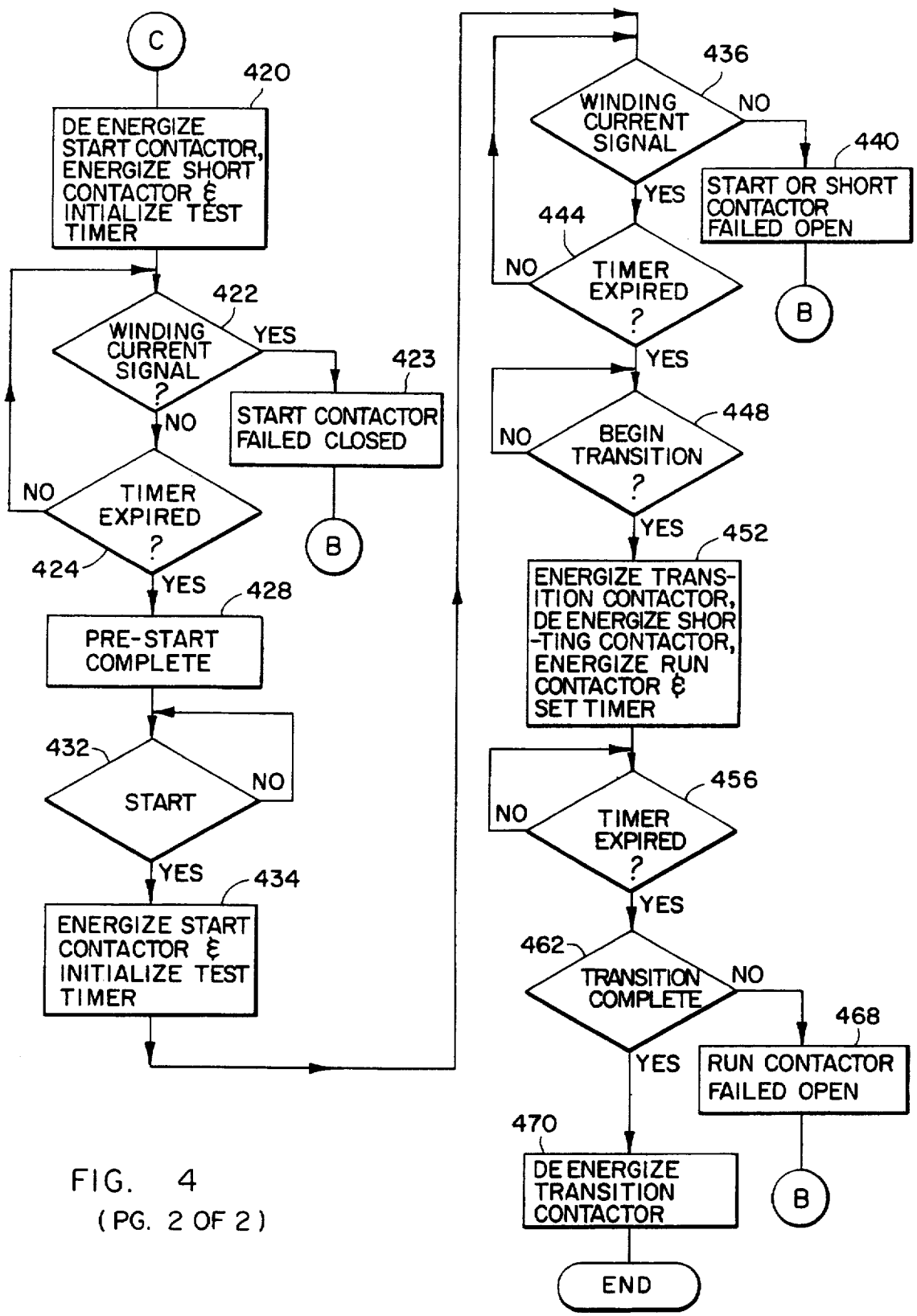
FIG. 4 is a software flowchart of computer program executed by the control module of FIG. 1 to energize the motor and perform diagnostics on the starter circuit.

FIG. 3–5 are flowcharts illustrating computer software programs for implementing an embodiment of the present invention. The programs depicted in these flowcharts are particularly well adapted for use with the microcomputer and associated components described above, although any suitable microcomputer may be utilized in practicing an embodiment of the present invention. These flowcharts constitute a complete and workable design of the preferred software program, and have been reduced to practice on the NEC 78C 17IT microprocessor system. The software program may be readily coded from these detailed flowcharts using the instruction set associated with this system, or may be coded with the instructions of any other suitable conventional microcomputer. The process of writing software code from flowcharts such as these is a mere mechanical step for one skilled in the art.

FIG. 3 illustrates a portion of a program executed by the main control module 204 to initiate starting and stopping of the compressor motor 210. Initially, in the block 300, the control module determines whether the compressor motor 210 needs to be activated to reduce the temperature of the water flowing through the chiller circuit. The algorithm used to make this determination forms no part of the present invention and, hence, it is not explained in detail herein.

If the compressor motor 210 needs to be activated, control is passed to the block 302 where the main control module 202 issues a prestart command on the data link. In response to the prestart command, the various remote control modules 204 perform tests to determine if any conditions exist which make it unsafe or improper to energize the compressor motor 202. If a remote module 204 detects a faulty condition, it transmits an appropriate fault signal on the data link 206. In addition, certain faults may be of a nature that the motor 210 should not be started, in which case the remote module 204 can be programmed to issue an abort start signal. If a remote module 204 determines that the motor 210 can be started, it transmits a prestart complete signal via the data link 206.

In block 306, the main control module 202 checks to determine if the compressor motor 210 can be energized by sampling for the presence of an abort start signal. If an abort start signal is detected, the start routine is aborted and an appropriate message is displayed on the display screen 216. If no abort starts signals are detected, control is passed to the block 308 where the control module 202 checks to determine if the remote modules 204 have issued prestart complete signals. If the prestart complete signals have not been received from the remote control modules 204, control is returned to the block 306. However, if all appropriate control modules have issued a prestart complete signal, control is passed to block 314 where the main control module 202 issues a motor start command on the data link 206. The motor start command causes starter motor control module 16 to energize the compressor motor 210 as explained below.

Once the compressor motor 210 has been started, the main control module 202 periodically executes an algorithm at the block 320 to determine if the compressor motor 210 should be stopped. Again, this algorithm forms no part of the present invention and, hence, is not explained in detail. If it is determined that the motor 210 should be stopped, control is passed to the block 322 where the main control module 202 issues a motor stop command on the data link 206. The motor stop command causes the starter control module 16 to activate a stop sequence for deenergizing the compressor motor 210 as explained below.

FIG. 4 illustrates a START routine 400 that is performed by the starter control module 16 in response to receipt of the prestart command from the main control module 202. Initially, in the block 404, the starter control module 16 deenergizes all of the contactors 24, 32, 38, 58 in the starter circuit 14. Control is then passed to the block 406 where it is determined if the transition complete signal is present by measuring the electrical potential provided by the auxiliary run contact 92. Since the run contactor 32 is deenergized at this point, a high potential indicates that the run contactor 32 has failed in the closed position. If a high potential is detected, control is passed to the block 408 where a fault signal is transmitted on the data link 206 to indicate that the run contactor 24 has failed in the closed position. Control is then passed to the block 410 where an abort start signal is transmitted on the data link 206.

If a transition complete signal is not detected in the block 406, control is passed to the block 412 where the start contactor 24 is energized and a timer is initialized to a preselected value. Control is then passed to the block 414 where the control module 16 checks for the presence of a winding current signal by sampling the inputs from the current transformers 64. Current should not be flowing through the motor windings at this point because only the start contacts 28 are supposed to be closed. If a winding current signal is detected, it is assumed that either the run contactor 32, the short run contactor 38 or the transition contactor 58 has failed in the closed position. Hence, control is passed to the block 416 where a fault signal is transmitted on the data link 206 to indicate that one of these contactors has failed closed. Control is then to the block 410 where an abort start signal is transmitted on the data link 206.

If no winding current signal is detected in the block 414, control is passed to the block 418 where the control module 16 determines if the timer has expired. Control continues to loop through the blocks 414 and 418 until the timer expires. When the timer expires, control is passed to the block 420 where the start contactor 24 is deenergized, the shorting contactor 38 is energized and a timer is initialized to a preselected value. At this point, the motor windings should be connected in a wye configuration. Control is then passed to the block 422 where the control module 16 checks for the presence of a winding current signal. The mechanical interlock 50 prevents both the shorting contacts 42 and the run contacts 34 from being closed simultaneously and, hence, the presence of current in the windings indicates that the start contacts 28 have failed in the closed position. If a winding current signal is detected, control is passed to the block 423 where the control module 16 transmits a fault signal on the data link to indicate that the start contactor has failed closed. Control is then passed to the block 410.

If no winding current signal is detected in the block 422, control is passed to the block 424 where it is determined if the timer has expired. If the timer has expired, the control module 16 transmits a prestart complete signal on the data link 206. Control is then passed to the block 432 where the control module 16 checks for the presence of a start command on the data link. When a start command is detected, control is passed to the block 434 where the start contactor 24 is energized and the timer is reset. At this point, the motor 210 should be energized in a wye configuration, and current should be flowing through the motor windings.

Control is then passed to the block 436, where the control module 16 checks for the presence of a winding current signal. If no current flow is detected, control is passed to the block 440 where the control module 16 transmits a fault signal indicating that either the short contactor 38 or start contactor 24 has failed in the open position. However, if current flow is detected, control is passed to the block 444 it is determined if the timer has expired.

When the timer expires, control is passed to the block 448 where the control module 16 determines if the motor transition should begin by sampling the level of current flowing through the windings. When the current flow reaches a preselected value, control is passed to the block 452 to initiate transition from the wye connection to the delta connection.

Initially, in the block 452, the transition contactor 58 is energized, the shorting contactor 38 is deenergized and the run contactor 32 is energized. This configuration places the transition resistors 54 in series with the motor windings. At this point, the motor should be connected in a delta configuration. The transition resistors 54 remain in series with the windings until the timer expires and then control in the block 456 is passed to the block 462.

In the block 462 the control module checks for the presence of the transition complete signal. If the transition complete signal is not detected, it is assumed that the run contactor 32 has failed in the open position and control is passed to the block 468 where an appropriate fault signal is transmitted on the data link 206. However, if transition was successful, control is passed to block 470 which deenergizes the transition contactor 58. The motor 210 will continue to operate until the main control module 202 issues a stop command at which point the starter control module 16 deenergizes the motor by disconnecting it from the power source.

Traditionally, electric motors have been stopped by simultaneously deenergizing the run and start contactors to disconnect the motor from the power lines. However, when a motor is disconnected in this fashion, the energy stored in the windings causes arcing across the contacts in the starter circuit. Such arcing is undesirable because it reduces the life of contacts. Hence, it is desirable to provide a stop sequence which reduces the amount of energy that arcs across the contacts.

FIG. 5 illustrates an embodiment of a stop sequence which reduces the amount of arc energy during motor stopping. This flowchart can be used to program to control module 16 to deenergize the motor 18 in response to the motor stop command. In FIG. 5, the control module initially energizes the transition contactor 58 and sets a timer to a preselected value in the block 502. The transition contactor 58 closes the transition contacts 56, thereby placing the transition resistors 54 in parallel with the start and run contacts 28, 34. The starting circuit remains in this configuration until the timer times out and then control is passed to the block 506.

In the block 506, the run contactor 32 is deenergized, thereby connecting each transition resistor 54 in series with a different motor winding. The starting circuit 14 remains in this configuration for a preselected time and then control is passed to the block 510.

In the block 510, the shorting contactor 38 is energized to close the shorting contacts 42. This will connect the motor windings in a wye configuration, wherein each transition resistors 54 is connected in parallel with one of the motor phases. In this connection, the voltage applied to the windings is reduced by a factor of square root of 3 and the phase angle of the voltage applied to the windings by 30°. The starter circuit 14 remains in this configuration until the timer expires in the block 512 and then control is passed to the block 514.

In the block 514, the control module 16 deenergizes the start contactor 24 to disconnect the motor windings from the line voltages L1–L3. In the configuration, each transition resistor will be connected across the terminals of one of the motor phase windings and the resistors absorb energy that would otherwise cause arcing across the run contacts 28. When the timer expires in the block 516, control is passed to the block 518 where all of the contactors 24, 32, 38, 58 are deenergized to prepare the starter circuit 14 for the next start cycle.

I claim:

1. An apparatus for detecting faults in a starter circuit adapted to connect a multi-phase motor to a power supply, the motor having at least one terminal per phase, the starter circuit including a plurality of contactors which are energizable to connect the motor terminals to the power source, the apparatus comprising:

current sensing means for sensing the current flowing through each phase and responsively producing respective phase current signals; and diagnostic means for controllably energizing the contactors, sampling for the presence and absence of the winding current signals while different ones of the contactors are energized to detect faults in the contactors, and responsively producing fault signals.

2. An apparatus as set forth in claim 1, wherein the starter circuit is a wye-delta starter circuit.

3. An apparatus as set forth in claim 1, further including a display means for receiving the display signals and responsively providing a visual indication of the detected fault.

4. An apparatus as set forth in claim 1, wherein the diagnostic means disables the motor in response to the fault signals.

5. An apparatus as set forth in claim 1, wherein the diagnostic means includes a microprocessor.

6. An apparatus as set forth in claim 1, wherein the motor current sensor means includes one current transformer per motor phase, each current transformer being adapted to sense the current flowing through a respective motor phase and responsively produce a respective phase current signal.

7. An apparatus for detecting faults in a wye-delta starter circuit adapted to connect a three-phase motor to a three phase power supply, the motor having at least a first terminal and a second terminal per phase, the starter circuit including at least one shorting contactor adapted to receive a shorting signal and responsively close shorting contacts to connect the winding second terminals together, at least one starting contactor adapted to receive a start signal and close start contacts to connect each of the winding first terminals to a different power supply phase, and at least one run contactor adapted to receive a run signal and responsively close run contacts to connect each of the winding second terminals to a different one of the power supply phases, such that when the contacts of the run and shorting contactors are closed the motor is energized in a wye configuration and when the start and run contacts are closed the motor is energized in a delta configuration, the apparatus comprising;

current sensing means for sensing the current flowing through each phase and responsively producing respective phase current signals; and diagnostic means for controllably producing the short, start, and run signals, sampling for the presence and absence of the phase current signals while different combinations of the short, start and run signals are produced to detect faults in the contactors, and responsively producing fault signals.

8. An apparatus as set forth in claim 7, wherein the starter circuit includes one transition resistor per motor phase and at least one transition contactor adapted to receive a transition signal and close a transition contact, such that when the transition contactor, the start contactor and the shorting contactor are closed, each of the transition resistors is in parallel with a different one the motor phases; and wherein the diagnostic means controllably produces the short, start, run, and transition signals, samples for the presence and absence of the phase current signals while different combinations of the short, start, run and transition signals are produced to detect faults in the contactors, and responsively produces fault signals.

9. An apparatus as set forth in claim 7, further including a display means for receiving the display signals and responsively providing a visual indication of the detected fault.

10. An apparatus as set forth in claim 7, wherein the diagnostic means disables the motor in response to the fault signals.

11. An apparatus as set forth in claim 7, wherein the diagnostic means includes a microprocessor.

12. An apparatus as set forth in claim 7, wherein the motor current sensor means includes one current transformer per motor phase, each current transformer being adapted to sense the current flowing through a respective motor phase and responsively produce a respective current signal.

13. An apparatus as set forth in claim 7, wherein the diagnostic means produces a contactor failed closed signal in response to the presence of a phase current signal during production of only the start signal.

14. An apparatus as set forth in claim 7, wherein the diagnostic means produces a start contactor failed closed signal in response to the presence of phase current signal during production of only the short signal.

15. An apparatus as set forth in claim 7, wherein the diagnostic means produces a contactor failed open signal in response to the absence of a winding current signals during simultaneous production of the short signal and the start signal.

16. An apparatus as set forth in claim 7, further comprising:

transition sensor means for sensing transition of the motor from the wye configuration to the delta configuration and responsively produce a transition complete signal.

17. An apparatus as set forth in claim 16, wherein the transition sensing means includes an auxiliary run contact connected between first and second sources of electrical potential, the run contactor being adapted to close the auxiliary run contact in response to the run signal; and wherein the diagnostic means senses the potential applied by the closing the auxiliary run contactor to determine whether the auxiliary contact is in its open position or its closed position.

18. An apparatus as set forth in claim 16, wherein the diagnostic means produces a run contactor failed closed signal in response to the presence of the transition completed signal and the absence of the run signal.

19. An apparatus as set forth in claim 16, wherein the diagnostic means produces a run contactor failed open signal in response to the absence of the transition completed signal and the presence of the run signal.

20. A method for detecting faults in a starter circuit adapted to connect a multi-phase motor to a power supply, the motor having at least one terminal per phase, the starter circuit including a plurality of contactors which are energizable to connect the motor terminals to the power source, the method comprising the steps of:

controllably energizing the contactors;

sampling for the presence and absence of the terminal current signals while different ones of the contactors are energized to detect faults in the contactors;

producing fault signals in response to detected faults; and providing a visual indication of the nature of any detected faults in response to the fault signals.

21. A method as set forth in claim 20, wherein the starter circuit is a wye-delta starter circuit.

22. A method for detecting faults in a wye-delta starter circuit adapted to connect a three-phase motor to a three phase power supply, the motor having at least a first terminal and a second terminal per phase, the starter circuit including at least one shorting contactor adapted receive a shorting signal and responsively close shorting contacts to connect the second terminals together, at least one starting contactor adapted to receive a start signal and close start contacts to connect each of the first terminals to a different power supply phase, and at least one run contactor adapted to receive a run signal and responsively close run contacts to connect each of the second terminals to a different one of the power supply phases, such that when the contacts of the shorting and start contactors are closed the motor is energized in a wye configuration and when the start and run contacts are closed the motor is energized in a delta configuration, the method comprising the sets of:

controllably producing the short, start, and run signals in preselected combinations;

sampling for the presence and absence of current flow through the motor terminals while the preselected signal combinations are produced to detect failed conditions in the contactors; and producing fault signals that indicate the nature of the detected failed conditions in the contactors.

23. A method as set forth in claim 21, wherein the starter circuit includes one transition resistor per motor phase and at least one transition contactor adapted to receive a transition signal and close a transition contact, such that when transition contactor, the start contactor and the shorting contactor are closed, each of the transition resistors is in parallel with a different one the motor phases; and the method further comprises the steps of:

controllably producing the short, start, run, and transition signals; and sampling for the presence and absence of motor phase current signals while different combinations of the short, start, run and, transition are produced to detect faults in the contactors.

24. A method as set forth in claim 21, further comprises the step of providing a visual indication of a detected fault in response to the fault signals.

25. A method as set forth in claim 21, further comprising the step of disabling the motor in response to the presence of a fault signals.

26. A method as set forth in claim 21, further comprising the step of producing a contactor failed closed signal in response to the presence of a motor phase current signal during production of only the start signal.

27. A method as set forth in claim 21, further comprising the step of producing a start contactor failed closed signal in response to the presence of motor phase current signal during production of only the short signal.

28. A method as set forth in claim 21, further comprising the step of producing a contactor failed open signal in response to the absence of a motor phase current signals during simultaneous production of the short signal and the start signal.

29. A method as set forth in claim 21, further comprising the steps of:

producing a transition complete signal in response to the motor changing from the wye configuration to the delta configuration.

30. A method of verifying starter contact integrity while starting a wye delta starter which includes start contactors, run contactors, short contactors, transition contactors and auxiliary run contactors, the method comprising the steps of:

opening all start, run, transition, auxiliary run, and shorting contacts;
verifying that the auxiliary run contacts have closed;
closing the start contactor;
verifying current flow;
opening the start contactors;
closing the short contactors;
verifying current flow;
opening the start contractors;
verifying current flow;
closing the transition contacts;
opening the shorting contacts;
energizing the run contacts; and
opening the transition contacts.

* * * * *

UNITED STATES PATENT AND TRADEMARK OFFICE
CERTIFICATE OF CORRECTION

PATENT NO. : 5,563,489
DATED : October 8, 1996
INVENTOR(S) : Michael W. Murry

It is certified that error appears in the above-identified patent and that said Letters Patent is hereby corrected as shown below:

<u>In the claims</u>:

Claim 12, Column 9, Line 18, after the word "respective" insert the word --phase--.

Claim 15, Column 9, Line 29, delete the word "winding" and insert the word --phase--.

Signed and Sealed this

Tenth Day of December, 1996

Attest:

Attesting Officer

BRUCE LEHMAN

Commissioner of Patents and Trademarks